United States Patent [19]
Giovinazzi et al.

[11] Patent Number: 6,157,227
[45] Date of Patent: *Dec. 5, 2000

[54] DEVICE FOR NEUTRALIZATION IN AN INTEGRATED CIRCUIT

[75] Inventors: Thierry Giovinazzi; David Naura, both of Aix en Provence, France

[73] Assignee: SGS-Thomson Microelectronics SA, Gentilly, France

[ * ] Notice: This patent issued on a continued prosecution application filed under 37 CFR 1.53(d), and is subject to the twenty year patent term provisions of 35 U.S.C. 154(a)(2).

[21] Appl. No.: 08/993,377

[22] Filed: Dec. 18, 1997

[30] Foreign Application Priority Data

Dec. 19, 1996 [FR] France .................................. 96 15670

[51] Int. Cl.$^7$ ...................................................... H03L 7/00
[52] U.S. Cl. ............................................................ 327/143
[58] Field of Search .................................... 327/142, 143, 327/198, 80, 81

[56] References Cited

U.S. PATENT DOCUMENTS

| | | | |
|---|---|---|---|
| H497 | 7/1988 | Piasecki | 307/594 |
| 4,716,323 | 12/1987 | Wada et al. | 307/594 |
| 4,873,458 | 10/1989 | Yoshida | 307/362 |
| 4,886,984 | 12/1989 | Nakaoka | 307/272.3 |
| 4,948,995 | 8/1990 | Takahashi | 307/594 |
| 4,970,408 | 11/1990 | Hanke et al. | 307/272.3 |
| 5,027,006 | 6/1991 | Queinnec et al. | 307/272.3 |
| 5,115,146 | 5/1992 | McClure | 307/272.3 |
| 5,442,312 | 8/1995 | Walter | 327/198 |
| 5,528,184 | 6/1996 | Gola et al. | 327/198 |
| 5,552,736 | 9/1996 | Desroches | 327/198 |
| 5,565,811 | 10/1996 | Park et al. | 327/564 |
| 5,612,641 | 3/1997 | Sali | 327/143 |
| 5,696,461 | 12/1997 | Germini | 327/143 |

FOREIGN PATENT DOCUMENTS 0370737  5/1990  European Pat. Off. .

OTHER PUBLICATIONS

Patent Abstracts of Japan, vol. 013, No. 088 (E–721), Pub. No. 63266921, Pub. Date Apr. 11, 1988, Inventor: K. Takayuki "Power –On Reset Signal Generating Circuit".

*Primary Examiner*—Jeffrey Zweizig
*Attorney, Agent, or Firm*—Theodore E. Galanthay; Michael J. Buchenhorner; Fleit, Kain, Gibbons, Gutman & Bongini P.L.

[57] ABSTRACT

A neutralization device to reset or inhibit at least certain electronic functions of an integrated circuit depending on the level of the supply voltage Vdd comprises a conditional feedback means to deactivate it especially in standby mode and then eliminate its consumption, and to reactivate it for certain modes of operation of the integrated circuit.

16 Claims, 3 Drawing Sheets

6,157,227

DEVICE FOR NEUTRALIZATION IN AN INTEGRATED CIRCUIT

CROSS-REFERENCE TO RELATED APPLICATIONS

This application is based upon and claims the benefit of priority of the prior French patent application 96-15670 filed on Dec. 19, 1996, the contents of which are incorporated herein.

BACKGROUND OF THE INVENTION

The present invention relates generally to integrated electronics circuit devices and more specifically to a neutralization device to reset or inhibit at least certain electronic functions in an integrated circuit, depending on the level of the supply voltage. Most integrated circuits have a neutralization device of this kind, especially those with electrically programmable non-volatile memories.

In an integrated circuit, a device of this kind carries out the resetting of certain electronic elements, especially the sequential circuits such as the flip-flop circuits, when the integrated circuit is powered on or powered off. It also provides for the inhibition of certain modes of operation of the integrated circuit, if the supply voltage is not greater than a specified threshold, to prevent unpredictable behavior. In the field of electrically erasable or programmable non-volatile memories, examples of these modes of operation include, in particular, the operations of writing in these memories.

It will be understood therefore that the neutralization device fulfils a function that is vital to the operating safety of the integrated circuit in its applications environment. This function requires a static detection structure, namely one that enables the detection of a voltage level and not just a relative voltage variation (dV/dt).

As is known, a neutralization device of this kind comprises a voltage reference circuit series-connected with a current biasing means. The connection point between the reference circuit and the biasing means gives a level detection signal applied to the input of an inverter stage that gives a neutralization signal referenced POR at output.

The voltage reference signal determines the switch-over threshold Vs of the neutralization device. As shown schematically in FIG. 1, when the power is turned on, the neutralization signal POR follows the level of the supply voltage Vdd up to the switch-over threshold Vs, beyond which the neutralization signal POR is drawn to zero volts.

The following relationships are therefore obtained:

if $V_{cc}(t) < V_s$, $POR = V_{cc}(t)$ if $V_{cc}(t) > V_s$, $POR = 0$

The neutralization signal POR is applied to a circuitry for the resetting and disabling of the integrated circuit.

A neutralization device of this type is for example described in detail in the French patent application No. 96 01378 corresponding U.S. patent application Ser. No. 08/792,962. It works as soon as the power is turned on, to manage the power-on operation and the possible dropping and rising of the supply voltage in operational mode. This continuous operation leads to permanent current consumption, even when the electronic circuit is in standby mode (i.e., in a mode where, while the integrated circuit is powered, a circuit select signal CS for the selection of the integrated circuit is not activated).

While this permanent consumption is negligible as compared with that of the other electronic functions of the integrated circuit when it is activated, this consumption becomes the major component of the total consumption of the integrated circuit in standby mode.

As an order of magnitude, it may be said realistically this consumption amounts to about ten micro Amperes as compared with the figure of some milliamperes representing the total consumption of the integrated circuit when it is activated. This very substantial consumption in standby mode is becoming increasingly inconvenient because of the trend toward lowering the level of the supply voltage of the circuits. Accordingly, there is a need for a neutralization device in an integrated circuit that avoids the foregoing drawbacks.

SUMMARY OF THE INVENTION

Briefly, in accordance with the invention a neutralization circuit neutralizes the operation of an integrated circuit during low supply voltage conditions to avoid unpredictable operation. The neutralization circuit comprises a reference circuit coupled to the supply voltages an output stage, and means for neutralizing the integrated circuit. The reference circuit provides a detection signal, based on the level of the supply voltage, to the output stage which provides a neutralizing signal responsive to the detection signal. The means for neutralizing receives the neutralizing signal and responsive thereto neutralizes the integrated circuit.

BRIEF DESCRIPTION OF THE DRAWINGS

Other characteristics and advantages of the invention are described in detail in the following description, given by way of an indication that in no way restricts the scope of the invention and with reference to the appended drawings, of which.

DETAILED DESCRIPTION OF A PREFERRED EMBODIMENT

One solution to the technical problem described above has been found in the invention by using a neutralization signal POR as a feedback signal to deactivate the neutralization device while, however, attaching conditions to this feedback so as to take account of those modes of operation of the integrated circuit that are considered to be risky. The determining of the risky modes of operation depends essentially on the integrated circuit considered and on the application for which it is intended. In certain applications, as soon as the integrated circuit is selected (i.e., as soon as CS is activated), it is assumed that there is a risky configuration. In other applications, a risky configuration will be, for example, an operation of writing in a memory of the integrated circuit (with the write control signal activated.)

According to the invention, therefore, it is provided that when the current mode of operation of the integrated circuit corresponds to one of these modes considered to be risky, then a signal will reactivate the neutralization device independently of the state of the neutralization signal POR. Thus, there is a condition-related or conditional feedback.

If the feedback were not made conditional, then the neutralization device would not be capable of detecting a drop, if any, in the supply voltage and the neutralization device then would not be capable of fulfilling its security functions.

The use of a conditional feedback loop according to the invention enables the neutralization device to fulfil all its functions, while at the same time consuming nothing in the standby mode (where the integrated circuit is not selected) or in the other possible modes of operation considered to be no-risk modes.

As claimed, the invention therefore relates to a neutralization device for the resetting or inhibition of at least certain electronic functions in an integrated circuit as a function of the level of a supply voltage applied to said circuit, the neutralization device comprising a voltage reference circuit, one input of which is connected, at a connection point, to a current biasing means connected to the ground of the integrated circuit, the connection point giving a detection signal Sd applied to an inverter output stage which, at output, delivers a neutralization signal capable of activating a resetting and inhibition circuitry.

According to the invention, the neutralization device furthermore comprises a conditional feedback means comprising a logic circuit and a switch-over circuit series-connected between the biasing means and the ground, the logic circuit receiving, at input, the neutralization signal as a feedback signal, and a signal that is a function of the current mode of operation of the integrated signal as a conditional signal, the logic circuit delivering, at output, a control signal applied to the switch-over circuit so as to activate or deactivate the neutralization device by switching over or not switching over the ground.

Figure 2:
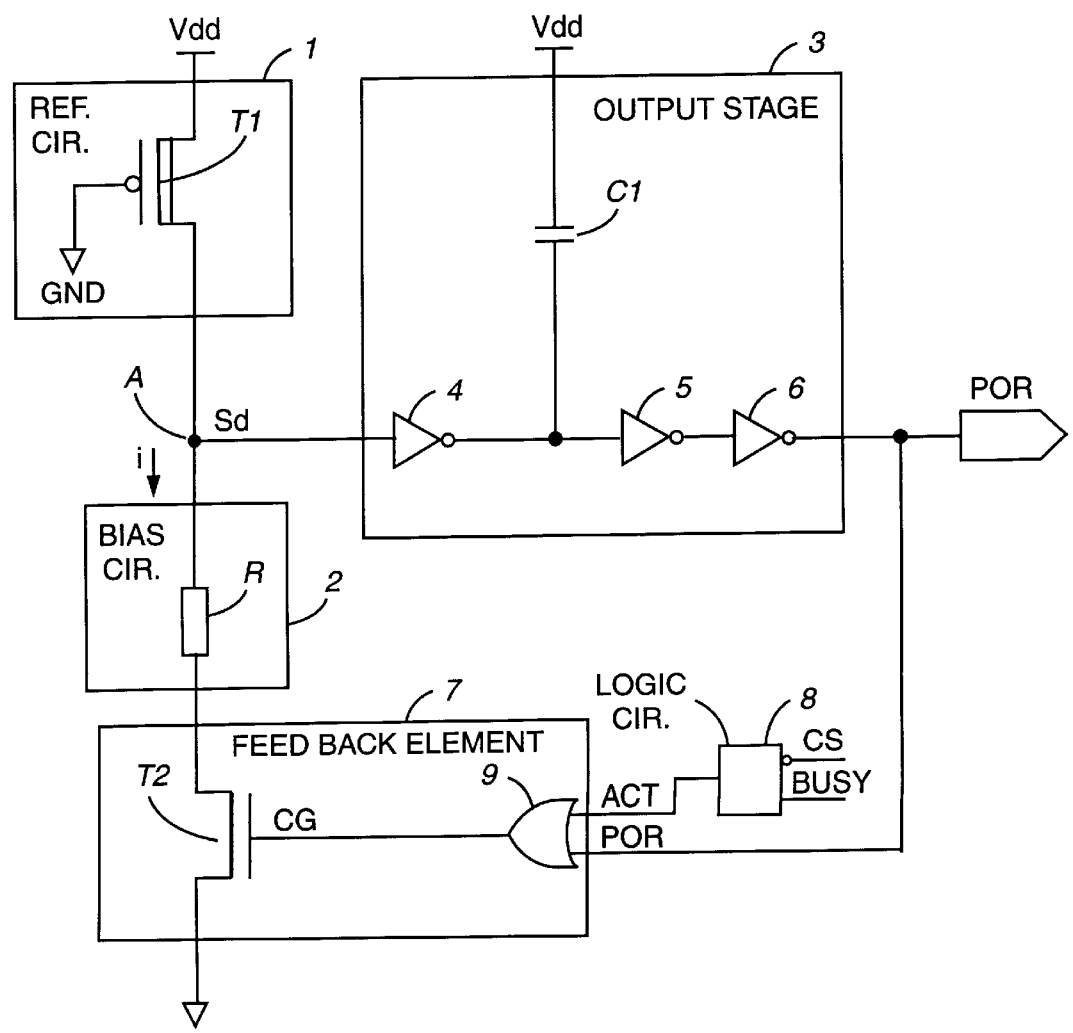
FIG. 2 shows a block diagram of a neutralization device according to the invention.

Referring to FIG. 2, an integrated circuit comprises a neutralization device in accordance with the invention. The device for the neutralization or deactivation of at least one function of the integrated circuit comprises, a voltage reference circuit 1 series-connected with a current biasing means 2 between a supply voltage Vdd of the integrated circuit and ground. A connection point A disposed between the voltage reference circuit 1 and the current biasing means 2 gives a detection signal Sd. This detection signal Sd is applied to an inverter 4 at the input of an inverter output stage 3. This output stage 3 delivers a neutralization signal POR at output.

In the exemplary embodiment made by MOS technology that is shown in this FIG. 2, the reference circuit 1 comprises a P-type native MOS transistor T1 whose gate, connected to ground potential, is set at zero volts and whose source is connected to the supply voltage Vdd. The biasing means 2 include a resistor R enabling a current I to be set up at the node A as soon as the supply voltage is sufficient, namely as soon as it is greater than the threshold voltage of the transistor T1.

A voltage reference circuit of this kind, biased by a current I, sets up a switch-over threshold voltage, Vs, equal to the switch-over voltage of the native P type transistor (T1), i.e., about 1.3 volts.

Other embodiments of the voltage reference circuit are possible, especially to set up a higher switch-over threshold or a threshold that is more stable in temperature. The choice of the embodiment does not affect the principle of the invention.

The output stage 3 has at least one first inverter 4 to deliver the neutralization signal POR. In practice, it has other inverters 5 and 6 coupled in series to reshape the neutralization signal. It also comprises the starting capacitor C1, connected between the output of the first inverter 4 and the supply voltage.

Figure 1:
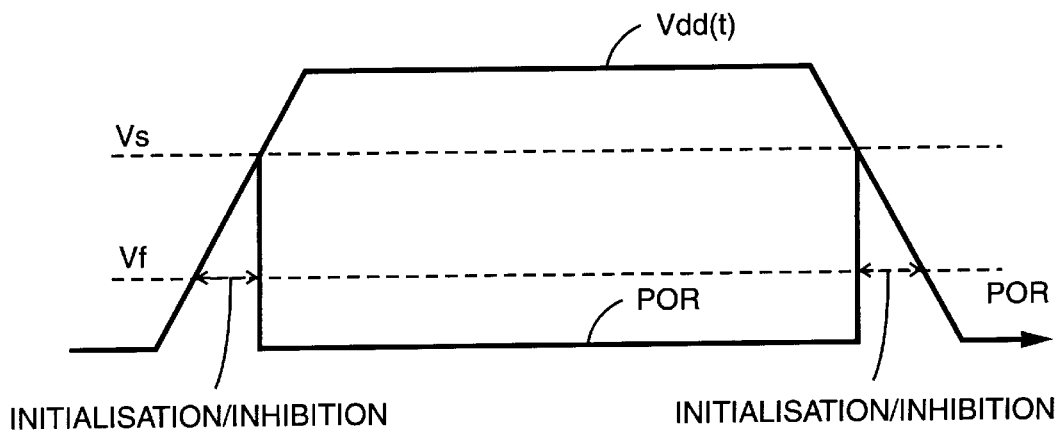
FIG. 1 shows a timing diagram of the neutralization signal POR seen in comparison with the supply voltage Vdd of the integrated circuit.

The working of the neutralization device described with reference to FIGS. 1 and 2 are briefly as follows: when the integrated circuit is powered on, the supply voltage Vdd increases gradually. Initially, it is not enough to make the electronic elements function. The starting capacitor C1 then enables the neutralization signal POR to be made to follow the supply voltage Vdd (FIG. 1). As soon as the supply voltage is sufficient, at last for the first inverter 4, this operation is confirmed: the signal POR follows the signal Vdd. When the supply voltage Vdd becomes greater than the supply voltage Vs dictated by the voltage reference circuit 1, the node A, which had previously been drawn to zero by the biasing circuit 2, again rises to a level close to Vdd (Vdd–Vt1 in practice, where Vt1 is the threshold voltage of the transistor T1). The first inverter 4 and the reshaping inverters 5 and 6 switch over and the signal POR is set at zero volts (FIG. 1). Conversely, when the supply voltage Vdd drops below the switch-over threshold Vs, the neutralization signal POR follows the level of the supply voltage Vdd until the integrated circuit is powered off.

A mode of operation as just set forth enables a resetting and inhibition circuitry to position the integrated circuit in a state that is defined (in particular for the resetting of the flip-flop circuits) and secure. It does not allow critically important operations (for example memory writing operations) in the period of time available when the voltage is below the switch-over voltage Vs but greater than a level Vf sufficient to bring about the operation of the electronic resetting/inhibition circuitry of FIG. 2.

Referring again to FIG. 2, in accordance with the invention, the neutralization device may additionally comprise conditional feedback element 7. The conditional feedback element 7 is connected between the biasing means 2 and the ground connection of the integrated circuit.

Feedback element 7 receives as inputs, the neutralization signal POR and a conditional signal ACT provided by a logic circuit 8 as a function of the current mode of operation of the integrated circuit. This conditional signal ACT, is generated in a logic circuit 8 from internal control signals of the integrated circuit. The feedback element 7 comprises a switch-over circuit, in this example an N type MOS transistor T2, series-connected between the biasing means 2 and the ground, and a logic circuit 9 for the control of the gate of this transistor. This logic circuit receives the two input signals POR and ACT, and delivers, at its output, a gate control signal CG to make the transistor T2 conductive or non-conductive. In this way, the means 2 are allowed to bias the voltage reference circuit 1 or are prevented from biasing it by the fact that the ground is switched over or not switched over.

The neutralization signal POR is a feedback signal which, after the power is turned on once as the supply voltage is greater than the switch-over threshold Vs, enables the deactivation of the neutralization device which then no longer consumes In this deactivated state, the neutralization device can no longer detect anything but relative voltage variations (dv/dt) by means of the starting capacitor C1. This enables the reactivation of the device by changing of the level of the neutralization signal POR. However the deactivated neutralization device cannot detect fast variations in voltage. Thus, for the risky modes of operation, the signal ACT is used to reactivate the neutralization device.

The signal ACT is generated by logic circuit 8 whose logic will depend on the integrated circuit and the application considered. In this example, logic circuit 8 receives, at its input, the signal CS for the selection of the integrated circuit and a signal called BUSY, indicating, for example, a write operation in a memory of the integrated circuit. When these two levels are active (usually CS=0 and BUSY=1), the logic circuit outputs an active level for the signal ACT. In this example, the signal ACT is active at 1. Thus, a simple logic OR function is sufficient. This logic OR function is represented schematically in FIG. 2 by an OR gate which receives the signals POR and ACT at its inputs. If POR=1 or ACT=1, then the neutralization device is activated (CG=1, T2 is on). Else, the device is deactivated: POR=0 and ACT=0 (CG=0, T2 is off).

Figure 3:
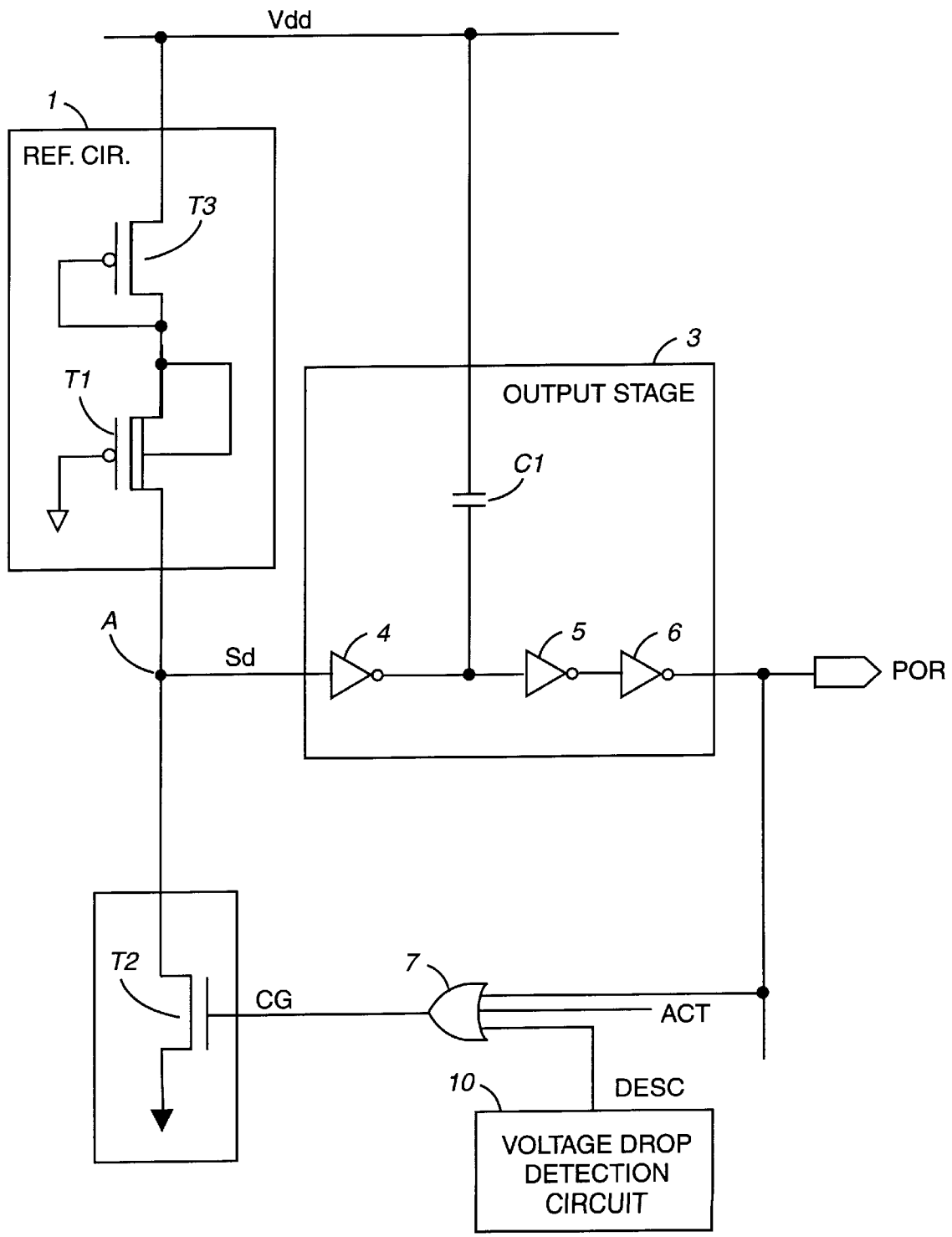
FIG. 3 shows a block diagram of an improved neutralization device according to the invention.

Another embodiment of the invention is shown in FIG. 3. This embodiment is suitable for instances when the device is in the deactivated state wherein the node A may be floating. It may get gradually discharged through parasitic capacitors or a starting capacitor C2 which may be planned at input of the first inverter, as will be seen further below. Or else, a drop in the supply voltage Vdd, by turning off the transistor T1 of the voltage reference circuit 1, will make this node A a floating node (the transistor T2 being off). This will hamper the detection of a drop in voltage. Indeed, it will be necessary to wait for the gradual discharge of the starting capacitor C1 which could modify the state of the signal POR to reactivate the device and confirm the detection of a drop in voltage. Now, if the supply voltage drops at excessive speed, the detection will be then far too slow to have the time to reset and inhibit the electronic functions of the integrated circuit before the integrated circuit is powered off.

The security of operation of the integrated circuit may be greatly affected. For these reasons, one improvement of the invention provides for the association, with the neutralization device, of a circuit for the detection of a drop in the supply voltage that is capable of reactivating the neutralization device in the event of a rapid drop in the supply voltage. This detection circuit, in a known way, uses a capacitor that is charged by the supply voltage and supplies an inverter which receives, at input, the supply voltage Vdd to be monitored. In the event of a rapid drop in the supply voltage, it is only the gate voltage that will shift in a time interval (given by the time constant associated with the capacitor), thus causing the inverter to switch over.

This detection of a rapid drop in supply voltage enables the reactivation, if need be, of the neutralization device: the node A is then drawn to zero volts by the transistor T2 which is turned on and the detection can be done under optimum conditions. This improvement in a way enables the preconditioning of the neutralization device in the event of a rapid drop in the supply voltage. The safety of operation of the integrated circuit is thereby improved. The term "rapid drop" is a relative term whose measure is given by the time constant associated with the capacitor C3: if the slope of decrease is less steep than this time constant, then the voltage difference between the gate and the source will remain substantially constant or will not vary sufficiently to make it conductive. On the contrary, if the slope of decrease is very steep, the voltage difference between the gate and the source will follow substantially the reverse slope and increase very rapidly: the transistor will become conductive.

Referring again to FIG. 3, a first alternative embodiment relates to the voltage reference circuit 1 in which a P type MOS transistor T3 has been added, having its gate and its drain connected together, between the supply voltage and the MOS transistor T1. This makes it possible to have a switch-over threshold that is higher than a diode threshold value (about 0.7 volts). A second variant relates to the transistor T2 of the feedback means which, furthermore, in the diagram of FIG. 3, fulfils the function of resistor of the biasing means 2. This transistor is referenced T2' in this FIG. For this purpose, it is enough to make the transistor T2 with a very small width to length (W/L) ratio. For example, T2 will have a ratio of 3 $\mu$/200 $\mu$ instead of having a ratio of 3 $\mu$/10 $\mu$ with a resistance R of 500 kiloohms. By using a resistive transistor T2 to carry out the function of the change-over switch of the feedback means 7 and of the resistor of the biasing means 2, a gain in compactness is obtained. However, a risk then arises of having problems of coupling due to the parasitic gate/drain capacitance of the transistor T2. This could give rise to troublesome oscillations for the node A.

Figure 4:
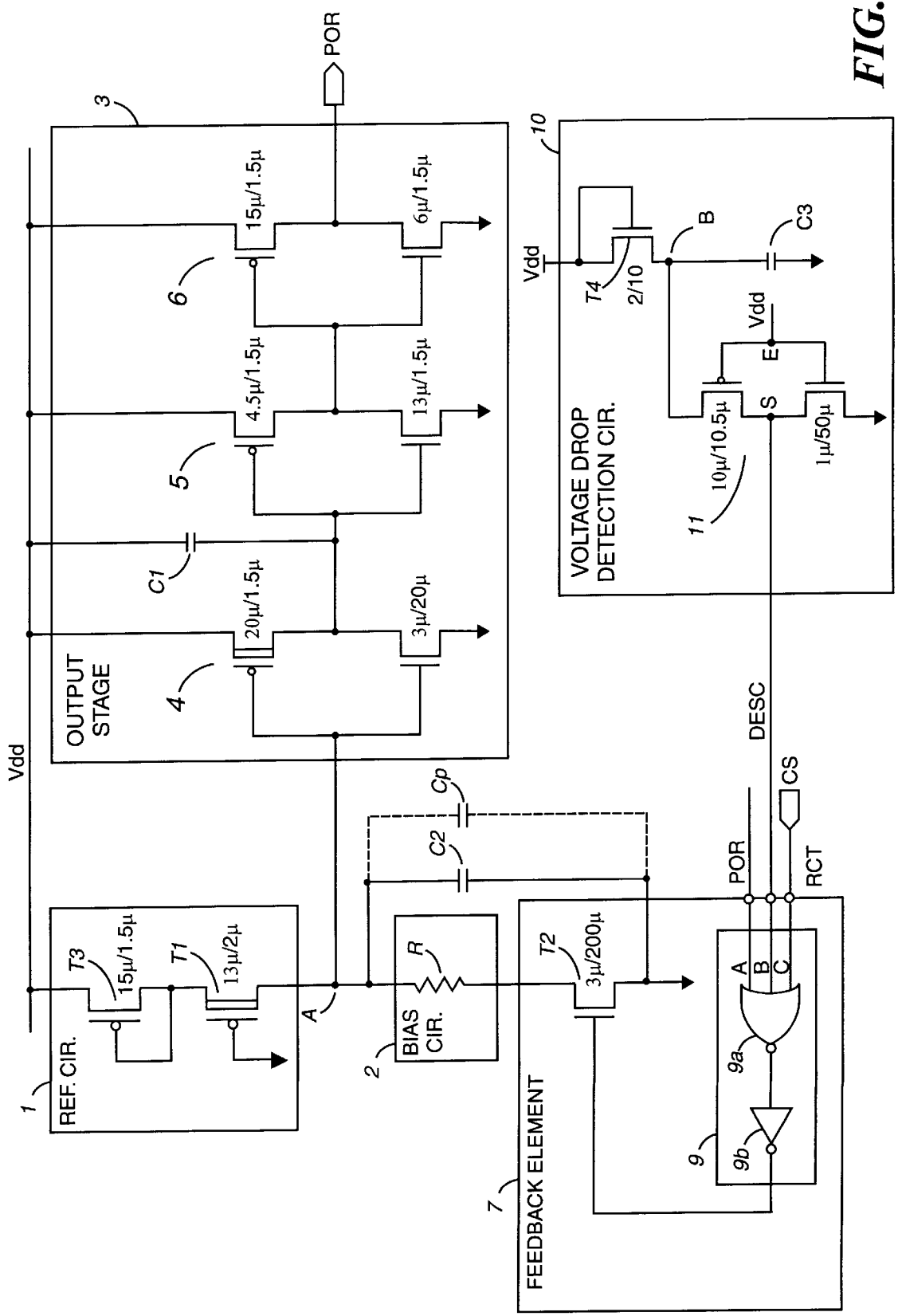
FIG. 4 shows a detailed diagram of an embodiment of an improved neutralization device according to the invention.

FIG. 4 shows a detailed schematic diagram of a practical embodiment of an improved neutralization device according to the invention. In this example, the inverters 4, 5 and 6 of the output stage 3 are of the CMOS type. Preferably, the P type MOS transistor of the first inverter 4 is a native transistor. This makes it possible to limit the consumption since a P type native transistor gets turned off more quickly since it has a higher conduction threshold. At the same time, on the transistor T2 of the conditional feedback means 7 and the resistor R of the biasing means 2, it is possible to provide for a starting capacitor C2, of which it can be noted that it is parallel-connected to a parasitic capacitor Cp. This starting capacitor is used for the complete discharging of the node A when the supply voltage Vdd is lower than the switch-over threshold Vs and when the neutralization device is deactivated (with the transistor T2 off). If a resistive transistor T2 is used as in the case of FIG. 3, it is possible in the same way to place a starting capacitor in a parallel connection.

As can be seen in FIG. 4, it is possible, for technological reasons, to choose a configuration where the logic OR function of the logic circuit 9 is fulfilled by means of a NOR gate 9a and an inverter 9b. These are alternative embodiments that depend chiefly on the technology of the integrated circuit considered and the designer's choices, and have no effect on the principle of the invention. At inputs A, B and C respectively, the NOR gate then receives the signals POR, DESC and ACT. The signal ACT, in the example, is simply the package selection signal CS. In this case, whenever the integrated signal is selected, the neutralization device is activated (transistor T2 on). An exemplary embodiment of a voltage drop detection circuit 10 is also described in detail in FIG. 4.

This circuit comprises a capacitive branch with a capacitor C3 whose terminal is connected to the ground, the other terminal being connected by a diode-mounted MOS transistor T4 (with the gate and drain connected together) to the supply voltage Vdd.

The connection B between the transistor T4 and the capacitor C3 delivers a voltage level VB applied as a supply voltage of an inverter 11. The inverter 11 is of the CMOS type in the example.

This inverter 11 receives, at its input E, the supply voltage Vdd of the integrated circuit and delivers, at its output S, the signal pertaining to the detection of a drop in the supply voltage Vdd, this detection signal being referenced DESC.

The operation of the inverter 11 is simple. If the supply voltage Vdd is stable, the gate and the source of the P type transistor of the CMOS inverter will perceive the same voltage level (not counting the threshold voltage of the transistor T4) and this transistor is off. If the supply voltage drops rapidly, the source will still perceive the same supply voltage because of the time constant related to the capacitor C3, while the gate voltage will have dropped: the P type transistor comes on, thus causing the inverter to switch over. The signal Desc goes from the state 0 to the state 1 which, in the invention, is used to reactivate the neutralization device (if this has not been done) and draw the node A to zero volts by means of the transistor T2 (or T'2) which is on. If there is actually a drop in the supply voltage, the signal POR will confirm the reactivation. A circuit 10 of this kind can detect only a rapid drop in supply voltage. If the drop in supply voltage is excessively slow, the difference in voltage that could be perceived between the gate and the source of the transistor P will not be sufficient to switch over the inverter. The use of a circuit 8 for the detection of a drop in voltage nevertheless entails one drawback which must not be overlooked depending on the applications in view. Indeed, it can be understood that if the supply of the integrated circuit is not a stabilized supply, there will be instances of untimely detection of drops in voltage. This will result in the repeated reactivation of the neutralization device. There could then be a considerable consumption by the integrated circuit in standby mode. This runs counter to the aim in view.

What is claimed is:

1. An information handling system comprising a neutralization device for selectively inhibiting at least one electronic function in an integrated circuit, as a function of the level of a supply voltage applied to said integrated circuit, the neutralization device comprising:

a voltage reference circuit coupled between a supply voltage and a connecting point;

a current biasing circuit coupled between ground of the integrated circuit and the connecting point;

an inverter output stage having an input coupled to the connecting point and an output for providing a neutralization signal for selectively inhibiting the at least one electronic function in the integrated circuit;

a conditional feedback circuit comprising a switch series-connected between the current biasing circuit and ground, and a first logic circuit receiving the neutralization signal as a feedback signal and a first control signal as a conditional signal, the first logic circuit outputting a second control signal applied to the switch so as to activate or deactivate the current biasing circuit; and a second logic circuit for providing the first control signal based on the current mode of operation of the integrated circuit so as to activate the current biasing circuit at least while a write operation is being performed in a memory of the integrated circuit.

2. The system according to claim 1, wherein the switch comprises a transistor.

3. The system according to claim 2, wherein the biasing circuit comprises a resistor.

4. The system according to claim 3, further comprising a starting capacitor coupled between the connecting point and ground.

5. The system according to claim 1, wherein a transistor coupled between the connecting point and ground functions as both the biasing circuit and the switch.

6. The system according to claim 1, further comprising a detection circuit for detecting a fast drop in the supply voltage, the detection circuit including a capacitor and an inverter, the time constant associated with the capacitor determining the slope of the minimum detectable decrease, and the output of said detection circuit being supplied as another conditional signal to the first logic circuit.

7. The system according to claim 1, wherein the second logic circuit receives a selection signal for selecting the integrated circuit.

8. The system according to claim 1, wherein the second logic circuit receives a selection signal for selecting the integrated circuit and other control signals corresponding to particular operations of the integrated circuit.

9. An integrated circuit comprising a neutralization device comprising:

a voltage reference circuit coupled between a supply voltage and a connecting point;

a current biasing means coupled between ground of the integrated circuit and the voltage reference circuit;

an inverter output stage having an input coupled to the connecting point for receiving a detection signal and an output for providing a neutralization signal for selectively inhibiting at least one function of the integrated circuit; and conditional feedback means coupled between the current biasing means and the output of the inverter output stage, the conditional feedback means including a first logic circuit receiving the neutralization signal as a feedback signal and a control signal as a conditional signal, the first logic circuit controlling the operation of the conditional feedback means so as to activate or deactivate the current biasing means; and a second logic circuit for providing the control signal based on the current mode of operation of the integrated circuit so as to activate the current biasing means whenever a write operation is performed in a memory of the integrated circuit and deactivate the current biasing means when the write operation is completed.

10. The integrated circuit according to claim 9, wherein the conditional feedback means includes a transistor switch.

11. The integrated circuit according to claim 10, further comprising a starting capacitor parallel-connected with the biasing means and the transistor switch.

12. The integrated circuit according to claim 9, further comprising a detection circuit for detecting a fast drop in the supply voltage, the detection circuit including a capacitor and an inverter, the time constant associated with the capacitor determining the slope of the minimum detectable decrease, and the output of said detection circuit being supplied as another conditional signal to the first logic circuit.

13. The integrated circuit according to claim 9, wherein the second logic circuit receives a selection signal for selecting the integrated circuit.

14. The integrated circuit according to claim 9, wherein the second logic circuit receives a selection signal for selecting the integrated circuit and other control signals corresponding to particular operations of the integrated circuit.

15. The integrated circuit of claim 9, wherein the second logic circuit comprises an input for receiving a write signal indicating a write operation in a memory of the integrated circuit, and the control signal is provided responsive to the write signal.

16. A method for neutralizing an integrated circuit receiving a supply voltage, said method comprising the steps of:

using a circuit that includes a current biasing means to provide a voltage level representative of a level of the supply voltage;

providing a detection signal representative of a drop in the supply voltage below a predetermined level;

neutralizing at least one function of the integrated circuit responsive to the detection signal; and selectively activating and deactivating the current biasing means based on the detection signal and a control signal that is a function of a current mode of operation of the integrated circuit such that the current biasing means is activated at least while a write operation is being performed in a memory of the integrated circuits, regardless of the detection signal.

* * * * *